United States Patent
Chandar et al.

(10) Patent No.: US 6,853,212 B2
(45) Date of Patent: Feb. 8, 2005

(54) GATED SCAN OUTPUT FLIP-FLOP

(75) Inventors: G. Subash Chandar, Tamil Nadu (IN); Jais Abraham, Kerala (IN)

(73) Assignee: Texas Instruments Incorporated, Dallas, TX (US)

( * ) Notice: Subject to any disclaimer, the term of this patent is extended or adjusted under 35 U.S.C. 154(b) by 120 days.

(21) Appl. No.: 10/324,900

(22) Filed: Dec. 20, 2002

(65) Prior Publication Data

US 2004/0119502 A1 Jun. 24, 2004

(51) Int. Cl.$^7$ .............................................. H03K 19/00
(52) U.S. Cl. .......................... 326/16; 326/46; 327/202
(58) Field of Search .............................. 326/16, 38, 40, 326/46; 327/202–203, 208–212, 218; 714/726, 729

(56) References Cited

U.S. PATENT DOCUMENTS

| | | | |
|---|---|---|---|
| 4,782,283 A | 11/1988 | Zasio | |
| 5,444,404 A | * 8/1995 | Ebzery | ..................... 327/185 |
| 5,592,493 A | 1/1997 | Crouch et al. | |
| 5,717,700 A | 2/1998 | Crouch et al. | |
| 5,719,878 A | * 2/1998 | Yu et al. | ..................... 714/726 |
| 5,831,993 A | 11/1998 | Graef | |
| 5,881,067 A | 3/1999 | Narayanan et al. | |
| 5,886,901 A | 3/1999 | Magoshi | |
| 6,114,892 A | 9/2000 | Jin | |
| 6,680,622 B2 | * 1/2004 | Zounes | ..................... 326/16 |

* cited by examiner

*Primary Examiner*—James H. Cho
(74) *Attorney, Agent, or Firm*—Robert D. Marshall, Jr.; W. James Brady, III; Frederick J. Telecky, Jr.

(57) ABSTRACT

A scannable storage circuit is provided that has a separate a scan output buffer for driving the scan output. The scan output buffer is coupled to the storage element in a parallel manner with the data output buffer so that normal data propagation is not delayed. The scan output buffer is gated by a scan enable input so that the scan output is quiescent when the storage circuit is not in scan mode. The selectively enabled scan output buffer is embodied with only four transistors.

14 Claims, 4 Drawing Sheets

GATED SCAN OUTPUT FLIP-FLOP

FIELD OF THE INVENTION

This invention relates generally to integrated circuitry and more particularly to a scannable storage cell and method of operation for scan testing integrated circuitry.

BACKGROUND OF THE INVENTION

The complexity of modern integrated circuitry (ICs) continues to increase at an dramatic rate. Modern integrated circuits include millions of transistors contained on a single substrate. In order to create the millions of transistors on the substrate, the size of each transistor has decreased dramatically. Thus, today, a single integrated circuit takes up less area, operates more quickly, and consumes less power than ever before. However, with the increase in transistor numbers on each integrated circuit, the likelihood that at least one transistor contained on the integrated circuit malfunctions after fabrication also increases. Thus, various testing methods have been developed to verify the operation of integrated circuits after fabrication but prior to sale.

One testing methodology involves providing a certain set of inputs to the integrated circuit over many clock signals, reading the outputs generated by the inputs, and comparing the outputs to expected results. When the outputs fail to correctly compare to the expected results, the integrated circuit has improperly functioned. However, in order to test each particular internal logic portion of the integrated circuit, a huge number of variations in inputs must be provided. When the output is not the correct output when designing the integrated circuit, a diagnostic engineer must still spend a huge amount of time to identify which malfunctioning transistor or set of malfunctioning transistors caused the error. Thus, in modern integrated circuits (ICs), the ability to test internal logic with standard functional or operational vectors is no longer cost efficient. The transistor-to-package pin ratio is typically too large to successfully verify the internal structure of the chip in a reasonable amount of vectors or test time.

Further, many techniques that have been used to test and verify densely packed board designs cannot be used within the operation of the IC because there is no direct access to many of the circuits within the packaged and sealed IC.

As an alternative to prior testing techniques, the test technique of internal embedded scan design has become a cost effective solution to test the operation of ICs. Scan design is accomplished by altering the structure of standard flip-flops and latches (storage elements) within the IC into scan flip-flops and latches by providing a second alternate scan input for scan data parallel to the functional data input. The alternate input for scan data is generally implemented by placing a multiplexor in front of the standard input which selects either scan data or functional data. These "scannable" elements are then connected together in a serial shift register fashion by connecting the output of one element to the scan input of a next element via a "scan chain". The scan chain can load and unload internal IC state information by allowing scan data to be transferred from one element to another on each active clock edge when a scan enable signal is asserted.

The operation of ICs employing scan design may switch from the scan mode to the system mode at any clock cycle. In this fashion, a particular scan data sequence may be loaded into the scannable elements during scan mode, the particular sequence intending to produce a particular logic function outcome from the logic functions in the IC. Once the scan data sequence is loaded, the operation of the IC is switched to system mode for a single clock cycle, and the resulting system data is captured in the scannable elements. The IC is then placed in scan mode and clocked until the data is received at a serial output pin. The received data is then compared to expected results to verify the operation of the logic circuitry for the particular case. In this fashion, the operation of at least a portion of the logic circuitry in the IC may be verified even though this portion of the logic circuitry is internal to the IC and difficult to access directly via external pins of the IC.

By selectively loading scan data and varying clocking frequencies, the technique of providing scan data in scan mode and switching to system mode for a single clock cycle may be employed to determine the delay of portions of the logic circuitry in the IC. Scan data is first provided to the scan chain such that specific scan elements contain predetermined values. The predetermined values in the scan elements are selected so that specific results will be produced by the logic circuits receiving output from the scan elements and produced in connected scan elements. The predetermined values are selected so that the results produced in the connected scan elements differ from the values provided during scan mode. Thus, if the logic circuit functions properly, the data produced by the logic circuits will alter the values in the connected scan elements. However, if the logic circuits do not function within the clock period, the values in the respective scan elements will not change. Thus, by varying the scan data provided to the scan chain and also the frequency of operation, the inherent delay of particular logic circuits may be verified.

Thus, the scan design has the effect of turning each selected sequential scan device (flip-flop or latch) into an internal test point. In a typical scannable device, or for a flip-flop, the standard input is referred to as the D-input while the standard output is referred to as the Q-output. Thus, the D-input of each scannable device is a direct observable point, or primary output test point. Further, the Q-output or equivalent pin (such as Q/. an inverted output) of each scannable device becomes a direct control point, or primary input test point.

As one skilled in the art will readily appreciate, not every storage element must be converted to a scan element to provide benefits through scanning. If all elements are converted, then the design is known as a full-scan architecture. However, if only selected storage elements are converted, then the design is known as a partial-scan architecture. If either full-scan or partial-scan is supported, the economics of testing improve. A scan architecture of any type allows each scanned sequential device to be viewed as if it were a package pin which reduces the gate/transistor-to-pin ratio. Since the logic functions are more accessible, an IC incorporating scan architecture requires fewer test vectors and less test time. A reduction in testing time results in a reduction in per device cost of manufacturing the IC.

The cost of testing an IC is one of the two largest recurring economic costs in IC design, with the cost of silicon being the other. Because of the tradeoff between "cost of test" and "cost of silicon", scan design is not universally accepted by all design organizations. The use of scan flip-flops instead of the smaller non-scanned flip-flops requires more silicon space and therefore increases the cost of silicon. Further, the routing of the scan chain adds wire connections and interconnection routing to the design that also increases silicon area.

Typically, the Q output of a register or latch is connected to the scan data input of the next register in the scan chain to form a scan network, or scan net. In the functional mode of operation these register change state, which causes toggling of data on the scan net. The scan net is never sampled in functional mode but continues to toggle because each link is connected to the Q output of active registers. This results in a waste of power due to the capacitive loading effects of the scan net.

This problem is addressed in U.S. Pat. No. 5,717,700 "Method For Creating A High Speed Scan-Interconnected Set Of Flip-Flop Elements In An Integrated Circuit To Enable Faster Scan-Based Testing." A separate scan output is provided that includes scan enabling circuitry. This output is active only when a scan enable signal is asserted. However, a transfer gate that drives the scan output is connected directly to the Q output, so that the Q output sees an extra load that would increase the delay of the flip-flop while operating in normal mode.

U.S. Pat. No. 5,719,878 "Scannable Storage Cell And Method Of Operation" also teaches a separate enabled scan output. However, in this case a complex buffer and keeper circuit is connected to the Q output to form the separate scan output, requiring additional transistors and subsequent space.

Thus, there exists a need in the art for scan elements for a method of construction of individual scan circuits and flip-flops that facilitates the verification of an integrated circuit while allowing lower power operation in normal mode in a more spatially efficient manner.

SUMMARY OF THE INVENTION

In general, and in a form of the present invention a scannable storage circuit is provided that has a separate a scan output buffer for driving the scan output. The scan output buffer is coupled to the storage element in a parallel manner with the data output buffer so that normal data propagation is not delayed by loading the data output buffer. The scan output buffer is gated by a scan enable input so that the scan output is quiescent when the storage circuit is not in scan mode.

In one embodiment, the selectively enabled scan output buffer is embodied with only four transistors.

In another embodiment, the selectively enabled scan output buffer is embodied with only six transistors.

In another embodiment, the selectively enabled scan output buffer is embodied with only three transistors and a keeper device.

Advantageously, power is reduced when in normal operation mode and the low transistor count of the scan output buffer does not adversely affect the size of the storage circuit.

BRIEF DESCRIPTION OF THE DRAWINGS

Particular embodiments in accordance with the invention will now be described, by way of example only, and with reference to the accompanying drawings in which.

DETAILED DESCRIPTION OF EMBODIMENTS OF THE INVENTION

Although the invention finds application to digital microprocessors, such as Digital Signal Processors (DSPs), implemented, for example, in an Application Specific Integrated Circuit (ASIC), it also finds application to other forms of processors and to digital systems in general. An ASIC may contain one or more megacells which each include custom designed functional circuits combined with pre-designed functional circuits provided by a design library.

Figure 1:
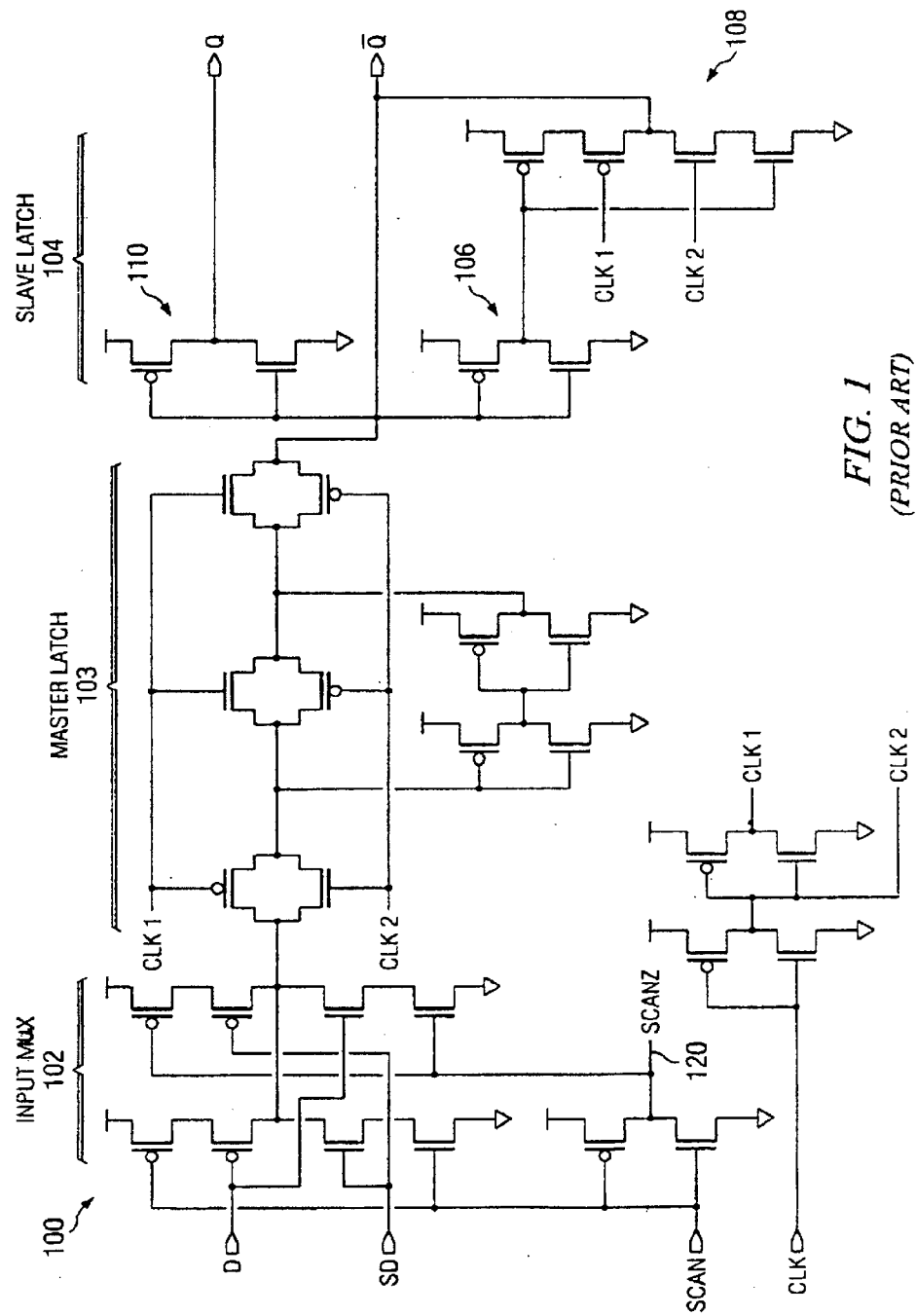
FIG. 1 is a schematic of a prior art flip-flop.

FIG. 1 is a schematic of a prior art flip-flop 100. The flip-flop includes an input multiplexer 102, a master latch 103 and a slave latch 104. The input mux selects either the data input (D) or the scan input (SD) in response to the state of the scan enable signal (SCAN) for input to the master latch. An inverted version 120 of the scan signal is also used to control the input mux. The master latch and slave latch are enabled by opposite phases (CLK1, CLK2) of a clock signal (CLK). A data bit selected by the mux is transferred via a transfer gate to the master latch on one clock phase, then transferred to the slave latch via a transfer gate on the following clock phase. Each latch is formed by two cross-coupled inverters. For example, the slave latch is formed by cross-coupled inverters 106 and 108. A buffer stage 110 is connected to one node of the cross-coupled inverters and drives the Q output terminal.

The Q output of the flip-flop is connected to the scan data input of the next register in the scan chain to form a scan network, or scan net. In the functional mode of operation the flip-flop changes state, which causes toggling of data on the scan net. The scan net is never sampled in functional mode but continues to toggle because each link is connected to the Q output of the active flip-flop and other active registers. As discussed above, this results in a waste of power due to the capacitive loading effects of the scan net.

Figure 2:
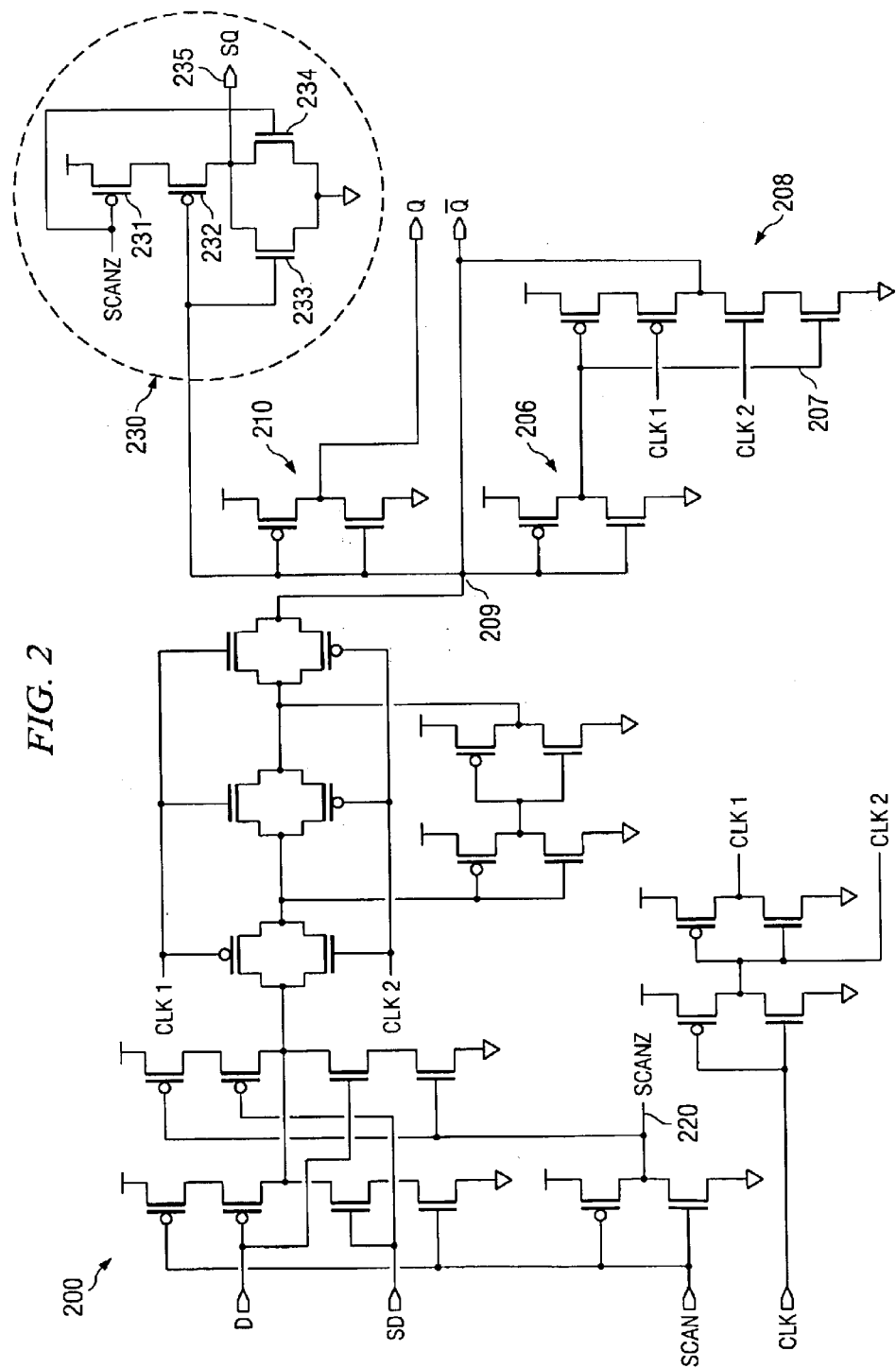
FIG. 2 is a schematic of a first embodiment of a flip-flop with a separate scan output, according to an aspect of the present invention.

FIG. 2 is a schematic of a first embodiment of a flip-flop 200 with a separate scan output, according to an aspect of the present invention. Flip-flop 200 is similar to flip-flop 100, with the exception of a separate scan output terminal 235, referred to as scan Q or SQ that is driven by a scan output buffer 230. The output of scan output buffer is enabled by the inverted version 220 (SCANZ) of the scan enable control signal (SCAN). Note that buffer stage 230 is an inverter in this embodiment. Whether the buffer is inverting or non-inverting is not important to the invention. In another embodiment, the buffer may be non-inverting.

In the scan mode, SCAN is active (asserted), which causes the scan input (SD) to be selected and applied to the master latch. The current contents of the slave latch are presented on output SQ and thence to the next storage circuit in the scan chain. In the functional mode, SCAN is inactive (deasserted) and the SQ output is therefore not active and is forced to a low signal level. Thus, there is no activity on the scan chain during the normal functional mode of operation. Advantageously, this results in power saving during normal functional operation.

The slave latch is formed by cross-coupled inverters 206 and 208. A data output buffer stage 210 is connected to one node 209 of the cross-coupled inverters and drives the Q output terminal. Scan output buffer 230 is connected to the storage element via node 209 in a parallel manner with the data output buffer. The other node 207 of the cross-coupled inverters is free in this embodiment. In this manner, data output buffer 210 is not loaded in any manner by the scan chain or scan output buffer so that data propagation time is not compromised in normal operational mode.

The scan output buffer consists of only four MOS transistors 231–234. Transistor 233 has its source/drains connected to the source/drains of transistor 234 in a parallel manner; one pair of source/drains is connected to a substrate voltage reference and the other pair of source drains connected to drive the scan output SQ. Transistor 231 has one source/drain connected to a source/drain of transistor 232 in a series manner. The other source drain of transistor 232 is connected to drive the scan output SQ. The other source/drain of transistor 231 is connected to a voltage source for the circuit. A gate of transistor 231 and a gate of transistor 234 are connected to inverted scan enable signal SCANZ. A gate of the transistor 232 and a gate of transistor 233 are connected to node 209 of the slave latch. Transistors 231 and 232 are both PMOS devices, while transistors 233 and 234 are both NMOS devices.

In operation, when scan mode is enabled, SCAN is asserted and SCANZ goes to a low voltage level. This turns on transistor 231 and turns off transistor 234. Transistors 232 and 233 then operate as an inverter and drive the SQ terminal with an inverted version of node 209, which is the same as provided on the Q output. When scan mode is disabled, SCAN is de-asserted and SCANZ goes to a high logic level. This turns off transistor 231 and turns on transistor 234 so that the SQ terminal is pulled to ground regardless of the contents of the slave register. Thus, the scan output buffer is operable to provide a representation of the storage element when the scan enable input is asserted, and to provide a steady low signal when the scan enable input is de-asserted.

Figure 3:
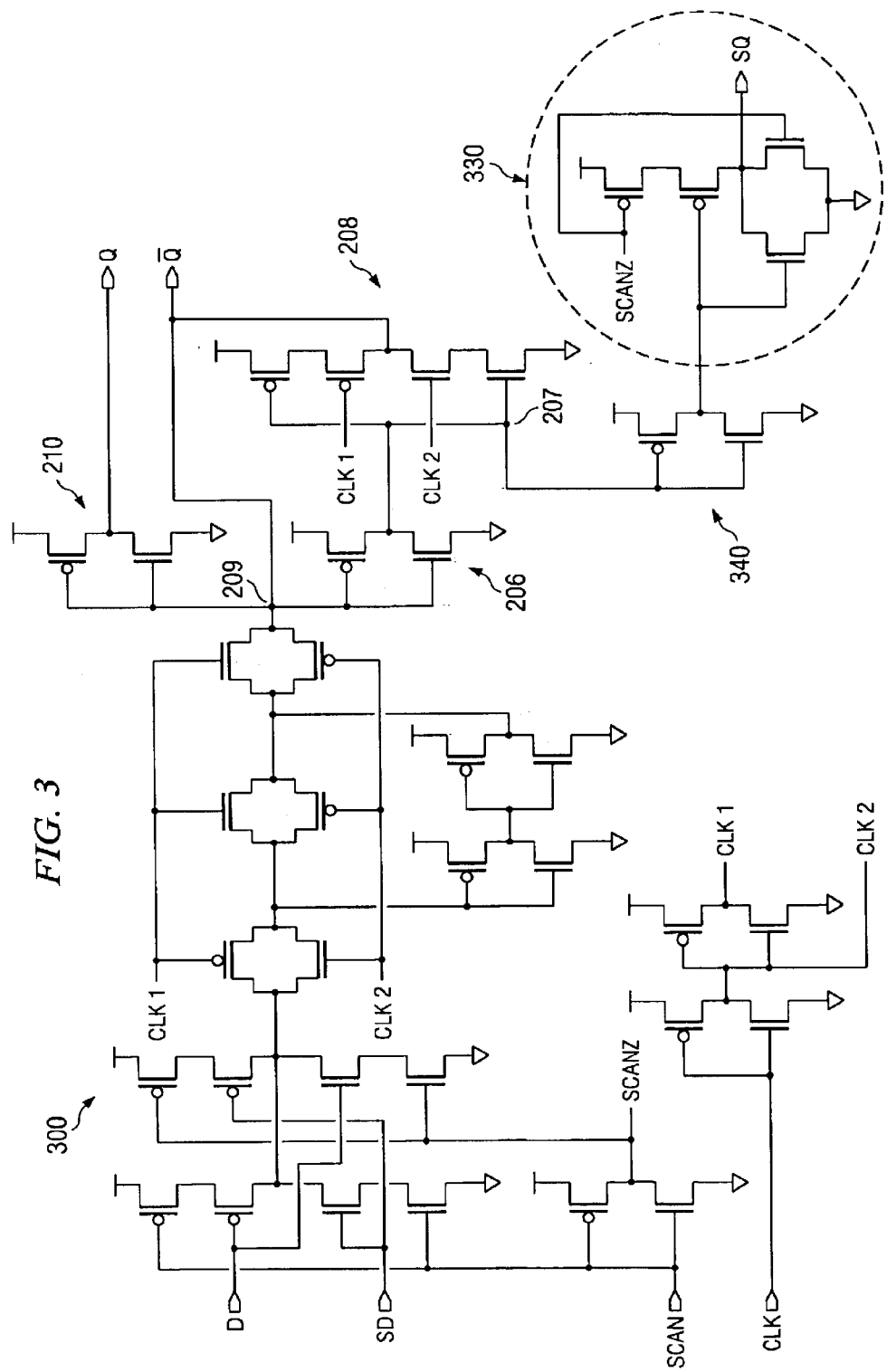
FIG. 3 is a schematic of a second embodiment of a flip-flop with a separate scan output.

FIG. 3 is a schematic of a second embodiment 300 of a flip-flop with a separate scan output SQ. In this embodiment, scan output buffer 330 is coupled via an inverter 340 to the other node 207 of the cross-coupled inverters 206, 208 in a parallel manner with the data output buffer. In this manner, data output buffer 210 is not loaded in any manner by the scan chain or scan output buffer so that data propagation time is not compromised in normal operational mode. Scan output buffer 330 operates the same manner as scan output buffer 230 of FIG. 2. Note that buffer stage 330 is an inverter in this embodiment. Whether the buffer is inverting or non-inverting is not important to the invention. In another embodiment, the buffer may be non-inverting.

Inverter 340 adds a small amount of propagation delay to the SQ output that can be used to compensate for clock skew that may affect the scan chain. If more delay is required, additional inverter stages can be added ahead of the scan output buffer in the embodiment of either FIG. 2 or FIG. 3. Greater clock to SQ delay means less hold violations and hence less buffers are required between SQ and the SD input of the next flip-flop. Advantageously, less total space and power may be required when using this embodiment as compared to the embodiment of FIG. 2. The clock to Q delay of this embodiment is also slightly less than that of the embodiment of FIG. 2.

Figure 4:
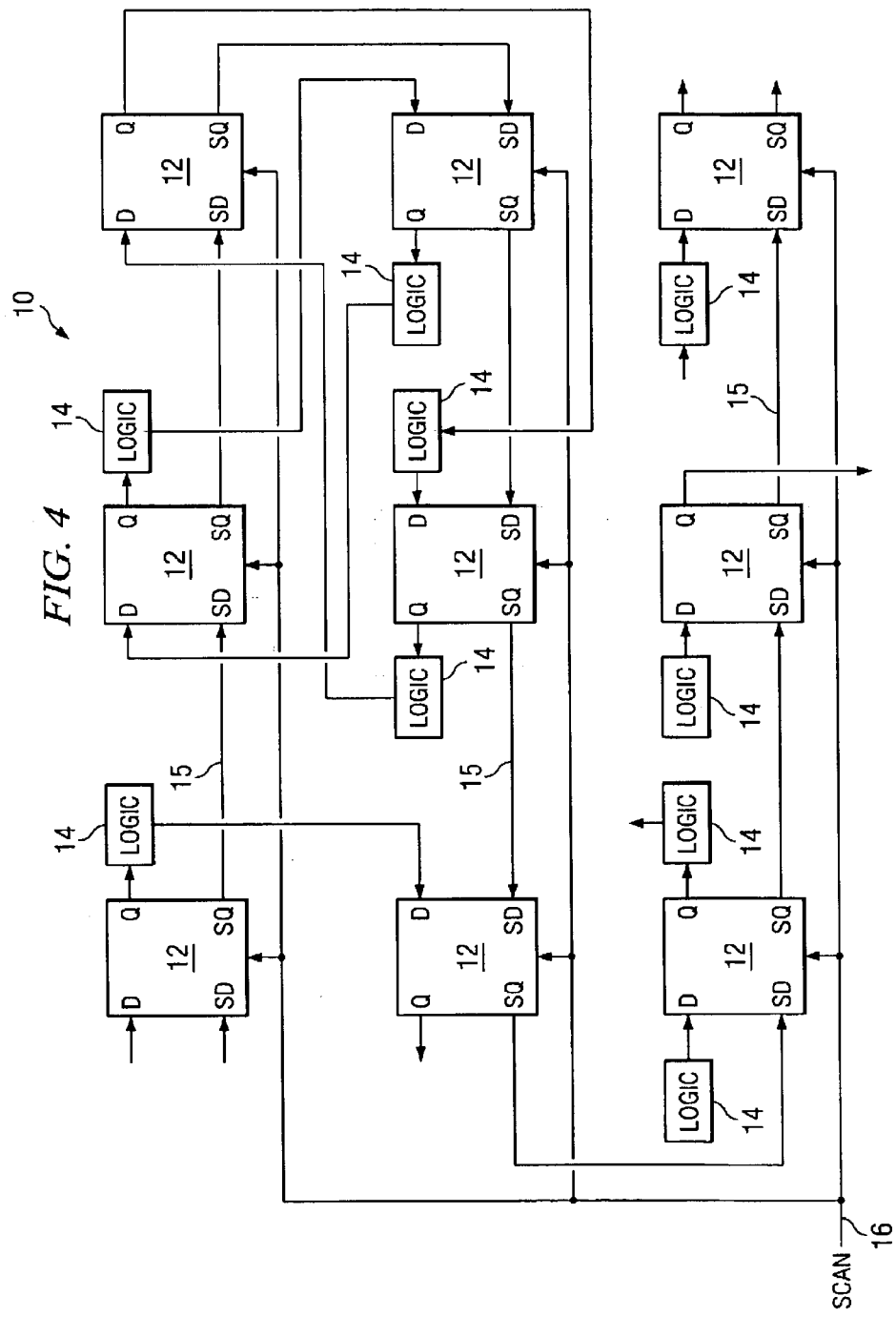
FIG. 4 is a schematic of a portion of a digital system having an embodiment of the present invention. Corresponding numerals and symbols in the different figures and tables refer to corresponding parts unless otherwise indicated.

FIG. 4 is a schematic of a portion of a digital system having an embodiment of the present invention. An integrated circuit 10 includes a plurality of scannable scan flip-flops 12 in a scan chain. The D flip-flops are scan flip-flops that are placed and routed in a place and route tool and optimized to ensure that the D-to-Q functional connections are operating at maximal performance and speed. This optimization is done without the inclusion of scan paths (SD/SQ paths) since scan path optimization simultaneous with functional path optimization results in both the scan path and functional path being less than optimal. Once the functional paths are optimized without scan paths and the D flip-flop positions are set via the functional optimization of the IC, the scan connections are inserted. In some cases, buffer or drivers need to be added in the scan path between devices or modules in the IC to further speed the scan path. In other words, functional connections are optimized first and then scan is inserted so that both scan and functional operation are maximized in speed and efficiency.

In FIG. 4, the plurality of scan flip-flops 12 receive system data at their D-input and provide output at their Q-output in a functional/normal mode of operation. Each of the scan flip-flops 12 receives its input through a logic function 14. The logic functions 14 provide for the logical operation of the integrated circuit 10 via interconnected logic gates such as AND, NAND, inverter, OR, NOR, transistors, and like logic devices. Each of the scan flip-flops 12 also receives scan data at scan data input terminal (SD) and provides scan data at a scan data output port (SQ). As one skilled in the art will readily appreciate, during a "scan mode" of operation of the integrated circuit, serial scan data is provided to each of the scan flip-flops 12 through scan data paths 15 as is illustrated. However, during a "system mode" of operation or "normal mode" of operation, the flip-flops receive data at their D-inputs via the logic functions 14.

Each clock cycle within the integrated circuit 10, when in a "scan mode," allows the serial scan data to proceed serially from one scan flip-flop 12 to the next scan flip-flop 12 in the scan data chain. In this fashion, scan data may be sequentially loaded to a first scan flip-flop 12 in the chain and provide throughout each scan flip-flop 12 in the chain until the serial scan data is provided as an output at has last scan flip-flop 12 in the chain. When in the scan mode, the basic operation of each of the scan flip-flops 12 in the scan data chain may be verified. The scan data chain may further be used to test the correctness of operation of each the logic circuits 14. By selectively loading a particular serial scan data sequence of logical 1's and 0's and shifting from the scan mode of operation and the system mode of operation, the logical operation of a particular logic function 14 may be verified by one or more clock cycles. As one skilled in the art will readily appreciate, such a scan data structure as is disclosed in FIG. 4 may be used to verify the logical operation of the integrated circuit 10.

When the scan enable signal 16 is deasserted, the scannable elements operate in a "system mode". In system mode, the scannable elements 12 capture system data at their D-inputs at each clock cycle. Standard logic circuitry 14 provides the system data to each scannable element and facilitates the logical operation of the IC. As one skilled in the art will readily appreciate, the input of a particular scannable element 12 will be provided by a particular logic function 14, the logic function 14 receiving as inputs the outputs of various scannable elements (Q-outputs) as well as system inputs. The logic function 14 will then perform a combinational logic function on the inputs to produce a logic function output and provide the logic function output as input to the scannable element.

Thus, a digital system is provided in which scan chains can be implemented using separately buffered SQ outputs so the performance is not compromised and each of the SQ outputs can be disabled while not in normal system mode, thereby saving power during normal system operation. The separate SQ buffers require only four additional transistors so that the physical size of each storage element is not significantly affected.

As used herein, the terms "applied," "coupled," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

While the invention has been described with reference to illustrative embodiments, this description is not intended to be construed in a limiting sense. Various other embodiments of the invention will be apparent to persons skilled in the art upon reference to this description. For example, the scan output buffer may be inverted so that the SQ terminal is pulled to a high logic level when the scan enable signal is deasserted. In this embodiment, the transistor types would be reversed accordingly.

In another embodiment, transistor 234 may be deleted and the SQ signal pulled either high or low by a high impedance keeper device to form a steady state quiescent signal.

In another embodiment, instead of being a D flip-flop, the storage circuit may be another flip-flop type such as a JK or an RS type, or a simple edge sensitive latch, for example.

In other embodiments using different semiconductor technology, devices other than NMOS or PMOS may be used.

It is therefore contemplated that the appended claims will cover any such modifications of the embodiments as fall within the true scope and spirit of the invention.

What is claimed is:

1. A digital system, comprising:
    a plurality of storage circuits interconnected together with logic circuitry to form at least a portion of a functional circuit, with each of the storage circuits having a scan input and having a scan output with the scan input of each storage circuit connected to the scan output of another storage circuit to form a scan chain, each of the storage circuits comprising:
    a scan enable input for controlling a mode of operation of the storage circuit;
    a storage element with a node connected to a data output buffer for driving a data output terminal, the storage element selectively coupled to a data input terminal and the scan input in accordance with the scan enable input;
    a scan output buffer for driving the scan output and coupled to the storage element in a parallel manner with the data output buffer, the scan output buffer being responsively coupled to the scan enable input; wherein the scan output buffer is operable to provide a representation of the storage element when the scan enable input is in a first state, and to provide a steady signal when the scan enable input is in a second state; and
    wherein the scan output buffer comprises a third MOS transistor with a source/drain connected to a source/drain of a fourth MOS transistor in a series manner, another source/drain of the third MOS transistor connected to drive the scan output with no other devices in electrical connection path between the other source/drain of the third MOS transistor and the scan output and another source/drain of the fourth MOS transistor connected to a voltage source with no other devices in electrical connection path between the other source/drain of the fourth MOS transistor and the voltage source.

2. The digital system of claim 1, wherein the scan output buffer further comprises:
    a first MOS transistor with source/drains connected to source/drains of a second MOS transistor in a parallel manner, one pair of source/drains connected to a voltage reference and the other pair of source/drains connected to drive the scan output;
    a gate of the first MOS transistor and a gate of the fourth MOS transistor being coupled to the scan enable input; and
    a gate of the second MOS transistor and a gate of the third MOS transistor being connected to the node of the storage element, whereby the data output buffer and the scan output buffer are connected to the storage element in a parallel manner.

3. The digital system of claim 2, wherein the storage element comprises a cross-coupled inverter circuit and wherein the input of the data output buffer and the gates of the second and third MOS transistors are all connected to one node of the cross-coupled inverters.

4. The digital system of claim 3, further comprising one or more buffer stages connected between the input of the scan output buffer and the node of the cross-coupled inverters.

5. The digital system of claim 3, wherein the first MOS transistor is replaced by a high impedance keeper devise, such that the keeper device is connected between the scan output and the voltage reference.

6. The digital system of claim 1, wherein the storage element comprises a cross-coupled inverter circuit and wherein the input of the data output buffer is connected to a first node of the cross coupled inverters; and
    wherein an input of the scan output buffer is coupled to a second node of the cross coupled inverters.

7. The digital system of claim 6, further comprising one or more buffer stages connected between the input of the scan output buffer and the second node of the cross-coupled inverters.

8. The digital system of claim 7, wherein the scan output buffer comprises:
    a first MOS transistor with source/drains connected to source/drains of a second MOS transistor in a parallel manner, one pair of source/drains connected to a voltage reference and the other pair of source/drains connected to drive the scan output;
    a third MOS transistor with a source/drain connected to a source/drain of a fourth MOS transistor in a series manner, another source/drain of the third MOS transistor connected to drive the scan output and another source/drain of the fourth MOS transistor connected to voltage source;
    a gate of the first MOS transistor and a gate of the fourth MOS transistor being coupled to the scan enable input; and
    a gate of the second MOS transistor and a gate of the third MOS transistor being connected to the output of the one or more buffer stages.

9. The digital system of claim 8, wherein the first MOS transistor is replaced by a high impedance keeper devise, such that the keeper device is connected between the scan output and the voltage reference.

10. A scannable storage circuit, comprising:

a scan enable input for controlling a mode of operation of the scannable storage circuit;

a storage element with a node connected to a data output buffer for driving a data output terminal; the storage element selectively coupled to a data input terminal and a scan input in accordance with the scan enable input;

a scan output buffer for driving a scan output and coupled to the storage element in a parallel manner with the data output buffer, the scan output buffer being responsively coupled to the scan enable input, wherein the scan output buffer is operable to provide a representation of the storage element when the scan enable input is in a first state, and to provide a steady signal when the scan enable input is in a second state; and wherein the scan output buffer comprises a third MOS transistor with a source/drain connected to a source/drain of a fourth MOS transistor in a series manner, another source/drain of the third MOS transistor connected to drive the scan output with no other devices in electrical connection path between the other source/drain of the third MOS transistor and the scan output and another source/drain of the fourth MOS transistor connected to a voltage source with no other devices in electrical connection path between the other source/drain of the fourth MOS transistor and the voltage source.

11. The scannable storage circuit of claim 10, wherein the scan output buffer further comprises:

a first MOS transistor with source/drains connected to source/drains of a second MOS transistor in a parallel manner, one pair of source/drains connected to a voltage reference and the other pair of source/drains connected to drive the scan output;

a gate of the first MOS transistor and a gate of the fourth MOS transistor being coupled to the scan enable input; and a gate of the second MOS transistor and a gate of the third MOS transistor being connected to the node of the storage element, whereby the data output buffer and the scan output buffer are connected to the storage element in a parallel manner.

12. The scannable storage circuit of claim 11, wherein the storage element comprises a cross-coupled inverter circuit and wherein the input of the data output buffer and the gates of the second and third MOS transistors are all connected to a same node of the cross-coupled inverters.

13. The scannable storage circuit of claim 12, further comprising one or more buffer stages connected between the input of the scan output buffer and the same node of the cross-coupled inverters.

14. The scannable storage circuit of claim 11, wherein the first MOS transistor is replaced by a high impedance keeper devise, such that the keeper device is connected between the scan output and the voltage reference.

* * * * *